(12) United States Patent
Totsuka et al.

(10) Patent No.: US 7,760,691 B2
(45) Date of Patent: Jul. 20, 2010

(54) HIGH-FREQUENCY CIRCUIT APPARATUS AND COMMUNICATION APPARATUS USING THE SAME

(75) Inventors: Takao Totsuka, Fujisawa (JP); Takashi Shiba, Yokosuka (JP); Osamu Hikino, Yokohama (JP)

(73) Assignee: Hitachi Media Electronics Co., Ltd., Iwate (JP)

( * ) Notice: Subject to any disclaimer, the term of this patent is extended or adjusted under 35 U.S.C. 154(b) by 96 days.

(21) Appl. No.: 11/976,954

(22) Filed: Oct. 30, 2007

(65) Prior Publication Data

US 2008/0070514 A1  Mar. 20, 2008

Related U.S. Application Data

(63) Continuation of application No. 11/478,849, filed on Jul. 3, 2006.

(30) Foreign Application Priority Data

Feb. 8, 2006  (JP)  ............... 2006-030418

(51) Int. Cl.
*H04B 1/46* (2006.01)
(52) U.S. Cl. ..................................... 370/337
(58) Field of Classification Search ............. None
See application file for complete search history.

(56) References Cited

U.S. PATENT DOCUMENTS

| 6,381,461 | B1 | 4/2002 | Besson et al. | |
| 7,142,884 | B2 * | 11/2006 | Hagn | 455/552.1 |
| 2007/0190954 | A1 * | 8/2007 | Murakami et al. | 455/132 |

FOREIGN PATENT DOCUMENTS

| DE | 100 53 205 A1 | 5/2002 |
| JP | 2003-204284 | 7/2003 |
| JP | 2004-186713 | 7/2004 |
| JP | 2004-222171 | 8/2004 |
| JP | 2005-210460 | 8/2005 |

OTHER PUBLICATIONS

MAXIM, "Measuring Differential Impedances with a Two-Port Network Analyzer", May 1, 2002, MAXIM Integrated Products, pp. 1-3.*
German Office Action Issued is German Patent Application No. 10-2006-029 984.1-35 dated on Jan. 21, 2008.
United States Office Action issued in U.S. Appl. No. 11/478,849, mailed Aug. 19, 2009.
United States Office Action issued in U.S. Appl. No. 11/976,956 dated Dec. 2, 2009.
Dec. 15, 2009 Office Action issued in corresponding U.S. Appl. No. 11/478,849, filed Jul. 3, 2006.

* cited by examiner

*Primary Examiner*—Chirag G Shah
*Assistant Examiner*—Steve Young
(74) *Attorney, Agent, or Firm*—McDermott Will & Emery LLP

(57) ABSTRACT

A high-frequency circuit has a duplexer and a filter. The duplexer performs wave separation of send and received signals as input thereto. The filter filters the input send signal. When the send and received signals of the first modulation method are input, the send signal and the received signal of the first modulation method are wave-separated and output by the duplexer. When the received signal of the first modulation method is input, the send signal and the received signal of the first modulation method are wave-separated and output by the duplexer, and the send signal of the second modulation method is filtered by the filter.

4 Claims, 10 Drawing Sheets

HIGH-FREQUENCY CIRCUIT APPARATUS AND COMMUNICATION APPARATUS USING THE SAME

RELATED APPLICATIONS

The present application is a continuation of U.S. application Ser. No. 11/478,849, filed Jul. 3, 2006, which claims priority of Japanese Patent application No. 2006-030418, filed Feb. 8, 2006, the contents of which are herewith incorporated by reference.

BACKGROUND OF THE INVENTION

The present invention relates to a high-frequency circuit apparatus and a communications apparatus using this device.

JP-A-2005-210460 discloses therein a so-called dual-support radiocommunication terminal device which has the functional supportability to a plurality of modulation methods.

SUMMARY OF THE INVENTION

In the technique as taught by JP-A-2005-210460, different signal receiving paths or channels are used in units of communication technologies, e.g., WCDMA and GSM methods. Thus, a need is felt to use an increased number of duplexers and surface acoustic wave (SAW) filters, which corresponds to the number of communication methods. This makes it difficult to downsize a high-frequency circuit apparatus (antenna common-use equipment) and reduce production costs thereof. As for the radiocommunication terminal device in its entirety, this device increases in number of parts or components required, resulting in difficulty in achievement of small size at low costs.

It is therefore an object of this invention to achieve downsizing of a high-frequency circuit apparatus and a communication apparatus using the same.

Above problems can be solved by the following means.

That is, (1) a high-frequency circuit apparatus responsive to send and received signals of a first modulation method and a second modulation method, the apparatus having:

a duplexer (DPX1) for performing wave separation of send and received signals as input thereto; and a filter (LPF1) for filtering the input send signal, wherein upon inputting of the send and received signals of the first modulation method, the send signal and the received signal of the first modulation method are wave-separated and output by the duplexer (DPX1), and upon inputting of the received signal of the second modulation method, the received signal of the second modulation method is wave-separated by the duplexer (DPX1) whereas the send signal of the second modulation method is filtered by the filter (LPF1).

(2) A high-frequency circuit apparatus responsive to send and received signals of a first modulation method and a second modulation method, the apparatus having:

a duplexer (DPX1) for performing wave separation of a send signal and a received signal of the first modulation method and for performing separation of a received signal of the second modulation method; and a filter (LPF1) for filtering the send signal of the second modulation method.

(3) A high-frequency circuit apparatus with supportability to a plurality of frequency bands including a band of TDMA method and a band of CDMA method, the apparatus having:

a second high-frequency switch (SW2) for switching an input send signal between a transmission path of a first communication system of the TDMA method and a transmission path of a seventh communication system of the CDMA method;

a first low-pass filter (LPF1) for causing attenuation of an unnecessary signal from one send signal as switched by the second high-frequency switch;

a first duplexer (DPX1) having a first port, a second port and a third port, for outputting to the second port a remaining send signal which is input from the first port and switched by the second high-frequency switch while applying thereto wave separation with a received signal different in frequency from the send signal and for outputting to the third port a received signal of the first communication system to be input from the second port and a received signal of the seventh communication system, which are in the same frequency band; and a first high-frequency switch (SW1) for switching a received signal as input from an antenna terminal (ANT) to the second port of the first duplexer (DPX1) and for switching to the antenna terminal both the send signal which is wave-separated by the first duplexer and is output from the second port and a send signal as output from the first low-pass filter (LPF1).

Other objects, features and advantages of the invention will become apparent from the following description of the embodiments of the invention taken in conjunction with the accompanying drawings.

DETAILED DESCRIPTION OF THE EMBODIMENTS

In the currently established over-the-air communication technologies of mobile cellular telephone systems, there are various types of approaches. Regarding the so-called time division multiple access (TDMA) method, it includes an extended global system for mobile (EGSM) communications system with a frequency band of 900 MHz and 1.8 GHz-band digital cellular system (DCS) which are employed in major European countries and in China, 800 MHz-band global system for mobile communications 850 (GSM850) and 1.9 GHz-band personal communication services (PCS) as mainly used in North America. As for the so-called wideband code division multiple access (WCDMA) method, operating frequency is different depending upon regions using the same— for example, Band5 (B5) with a frequency band of 800 MHz, Band1 (B1) of a 2 GHz band, and Band2 (B2), which are mainly used in North America, Europe and Japan.

The mobile phone radiocommunication system employs a dual-band cellular phone using in combination the EGSM and DCS or a triple-band cellular phone with EGSM and DCS plus PCS combined together for providing enhanced usability in respective region. Another example is a dual-mode mobile phone which combines together TDMA and WCDMA methods.

The dual-mode mobile phone is generally made up of an antenna module, an antenna resonator unit, a radio frequency integrated circuit (RFIC) unit, and a base-band unit. Due to co-existence of communication systems, circuit configuration becomes complicated with an increase in parts or components required therefor.

Figure 11:
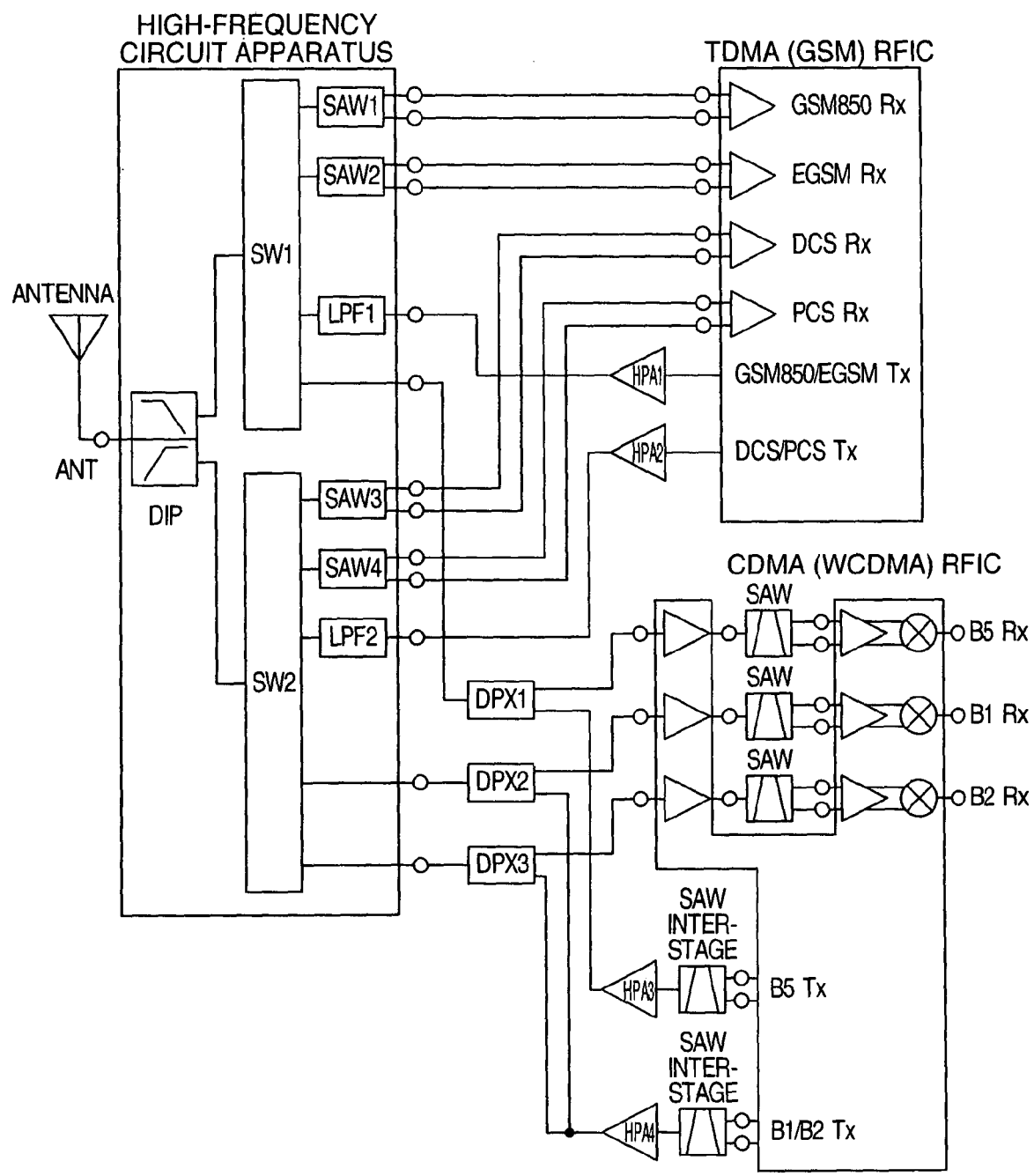
FIG. 11 is a block diagram of an exemplary configuration of a high-frequency circuit unit in known mobile phone systems.

See FIG. 11, which is a block diagram of one exemplary high-frequency circuit unit which is used in a dual-mode mobile phone system having supportability to GSM850, EGSM and DCS of the TDMA method and also to B1, B2 and B5 of the WCDMA method. This mobile phone system includes switches SW1 and SW2 which perform switching to either circuitry for the TDMA method or circuitry for WCDMA. In this mobile phone system, a circuit configuration is separated per communication method so that signal reception paths are different from each other. Accordingly, it becomes necessary to use a number of SAW filters or duplexers, which corresponds to the number of such different communication systems. This results in a likewise increase in total number of components in the entirety of the mobile phone system and an increase in manufacturing cost thereof.

In the dual-mode mobile phone system shown in FIG. 11 and the radio terminal device of JP-A-2005-210460, these are designed under the assumption that a multi-mode type radio-communication circuit is used, which has separate switchable signal paths or channels for a received signal of the WCDMA and a received signal of GSM, while preventing the received signal of GSM from going through to a duplexer. In other words, unlike embodiments of this invention as will be set forth later, none of the above-stated system and device are arranged to commonly use or "share" the high-frequency circuit—in particular, the duplexer or the like which is an internal circuit of the high-frequency circuit. Thus it is difficult to miniaturize the high-frequency circuit and lower the production cost thereof, which in turn makes it difficult to downsize the communication apparatus at low costs.

Currently preferred embodiments of this invention will be described with reference to the accompanying figures of the drawing below.

Embodiment 1

Figure 1:
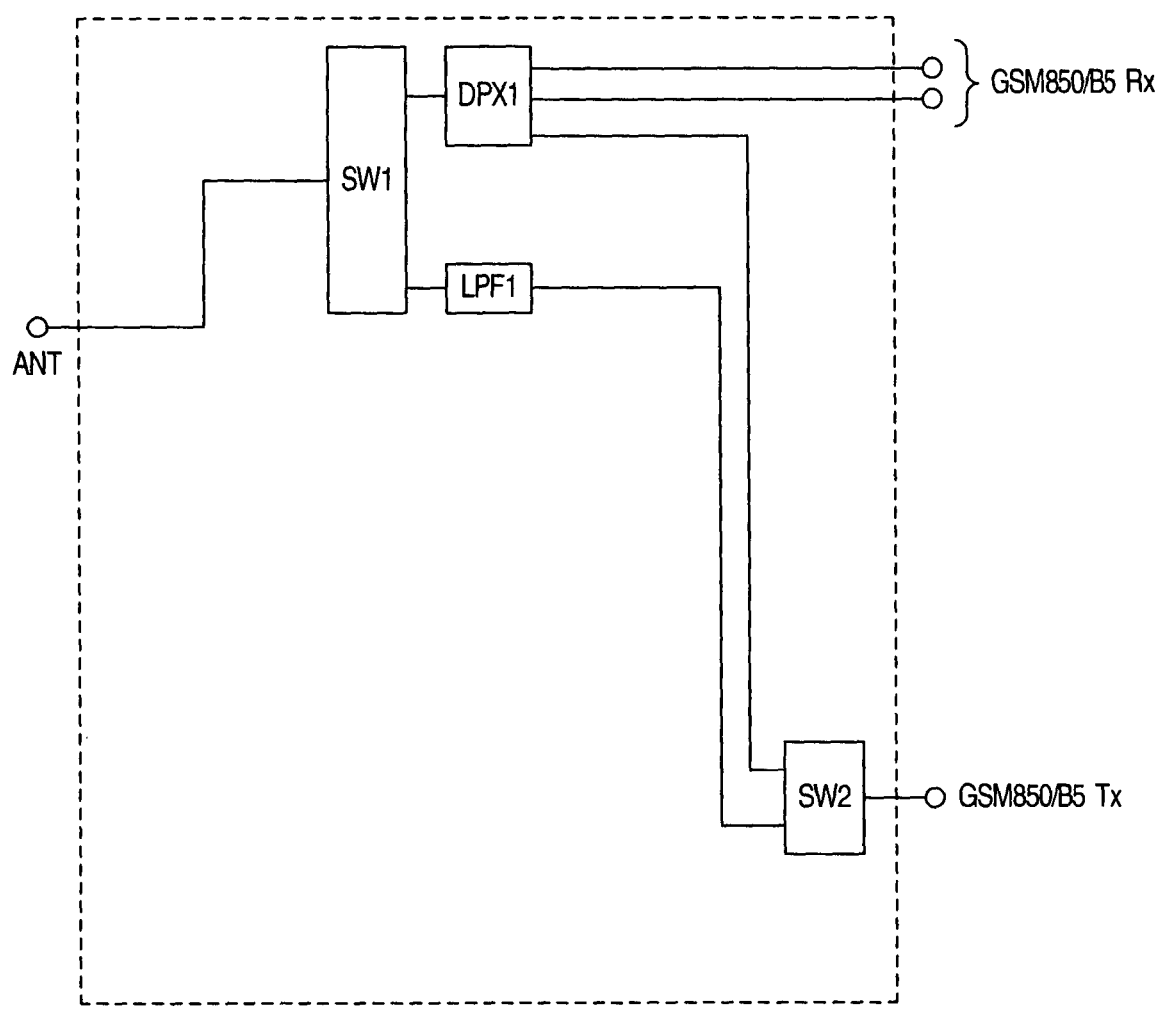
FIG. 1 is a block diagram showing a one exemplary configuration of a high-frequency circuit apparatus in accordance with Embodiment 1 of the present invention.

A high-frequency circuit apparatus in accordance with Embodiment 1 of this invention is shown in FIG. 1 in block diagram form. This apparatus has functional supportability to different types of communications systems, e.g., GSM850 of TDMA method, and B5 of WCDMA method. In FIG. 1, "ANT" is used to indicate an antenna terminal. A high-frequency switch SW1 switches a signal that is input from the antenna terminal ANT to a duplexer DPX1 as will be described later and switches to a signal transmission side low-pass filter LPF1, which is connected to a high-frequency switch SW2 to be later described.

The high-frequency switch SW2 performs switching between signal transmission paths in a way depending upon a presently selected communication system. More specifically, the high-frequency switch SW2 switches to either a transmission path of GSM850 or a transmission path of B5.

The duplexer DPX1 performs the wave separation and selective routing of a frequency-different signal. In other words, letting an output signal of the high-frequency switch SW1 pass through the duplexer DPX1 results in removal of an unnecessary signal or signals, whereby a received signal having its frequency band of 869 MHz to 894 MHz which is an inbound signal band within the frequency band (824 MHz to 894 MHz) of GSM850 and a received signal with its frequency band of 869 MHz to 894 MHz which is an inbound signal band within the frequency band (824 MHz to 894 MHz) of B5 are output to a GSM850/B5 Rx terminal while causing an output signal of the high-frequency switch SW2 to pass through the duplexer DPX1 to thereby remove unnecessary signals therefrom for output to the switch SW1. An example of the signal that is output from the high-frequency switch SW2 and then input to the duplexer DPX1 may be a signal of B5.

With such an arrangement, the received signal of WCDMA method and the received signal of TDMA method, which are of the same frequency band, are made identical to each other in signal reception path or channel. This makes it possible to singularize the SAW filter or the duplexer, which has traditionally been required for each signal reception path.

The signal reception paths of the received signal of WCDMA method and the received signal of TDMA method can be made the same in this way because of the fact that an overlapping signal reception frequency band is present in respective methods. More specifically, in the WCDMA method, there are a plurality of signal bands of B1, B2 and B5; in the TDMA (GSM), there are a plurality of signal bands of PCS, DCS, EGSM and GSM850. The illustrative embodiment is the one that utilizes the overlapping existence of the signal band of B5 of WCDMA method and the signal band of GSM850 of TDMA (GSM). The following embodiments also are principally based on this concept.

Embodiment 2

Figure 2:
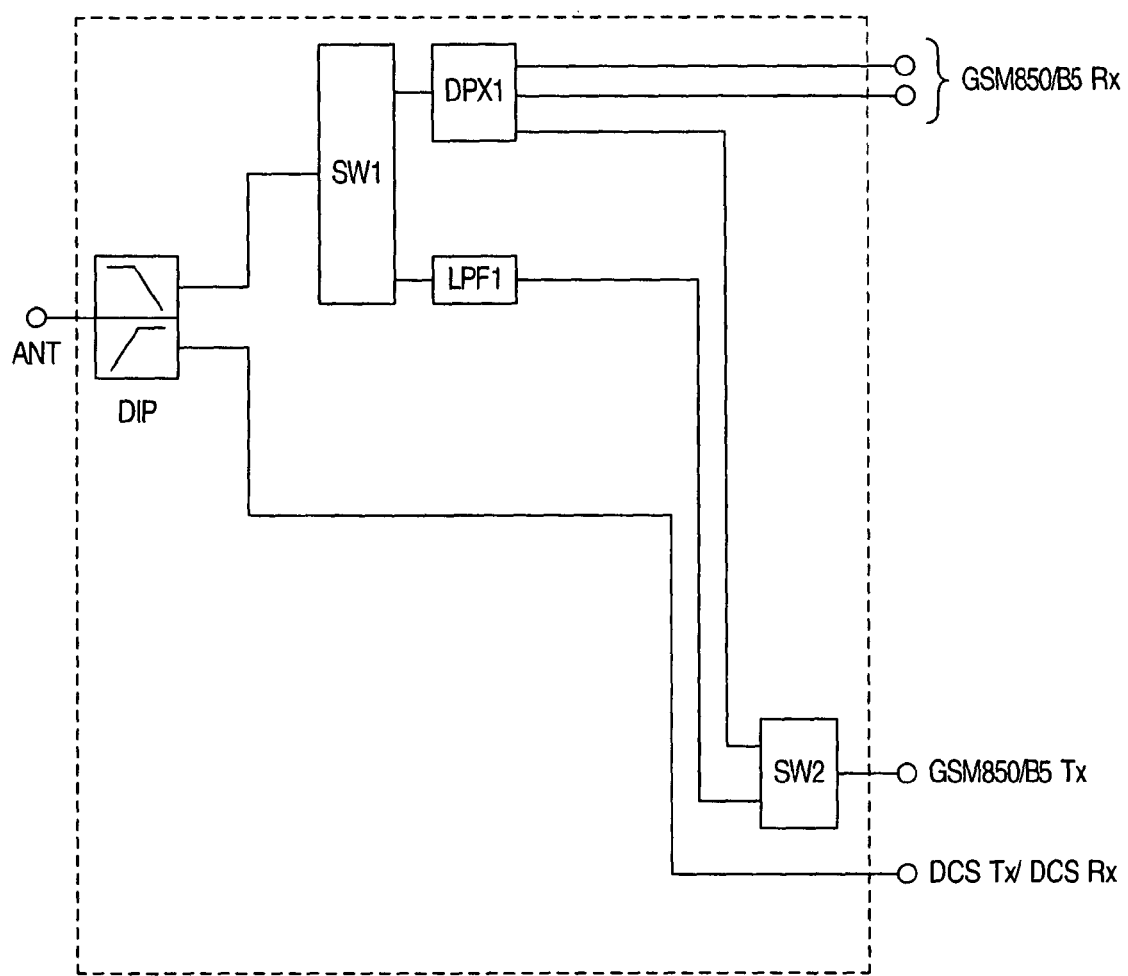
FIG. 2 is a block diagram showing an exemplary configuration of a high-frequency circuit apparatus in accordance with Embodiment 2 of the invention.

A high-frequency circuit apparatus in accordance with Embodiment 2 of the invention is depicted in FIG. 2 in block diagram form. This apparatus offers supportability to different communication systems, one of which employs the TDMA technology—e.g., GSM850, DCS—and the other of which uses the WCDMA method, such as B5.

This embodiment is similar in circuit configuration to the first embodiment stated supra, except that the former employs a diplexer (DIP) between the antenna terminal ANT and the high-frequency switch SW1.

In FIG. 2, DIP is the diplexer that is connected to the antenna terminal ANT. The diplexer DIP performs the wave separation of a signal having its frequency band of 824 MHz to 894 MHz of GSM850 as input from the antenna terminal ANT and a signal with a first frequency which is in a low frequency band including the signal of 824 MHz to 894 MHz band of B5 (Band 5) of WCDMA method and also a signal of a second frequency that is a high frequency band including the signal of 1710 MHz to 1880 MHz of DCS.

Using the diplexer DIP makes it possible to secure establishment of the channels for a plurality of frequency-different communication systems. Use of the diplexer DIP at a poststage of the antenna terminal ANT suppresses or prevents the signal of the first frequency, which is in the low frequency band, from attempting to leak into the signal path of the second frequency in the high frequency band. Furthermore, any unnecessary signals which are generated from the high-frequency switch SW1 that is a nonlinear device are reduced by letting them pass through the diplexer DIP.

Embodiment 3

Figure 3:
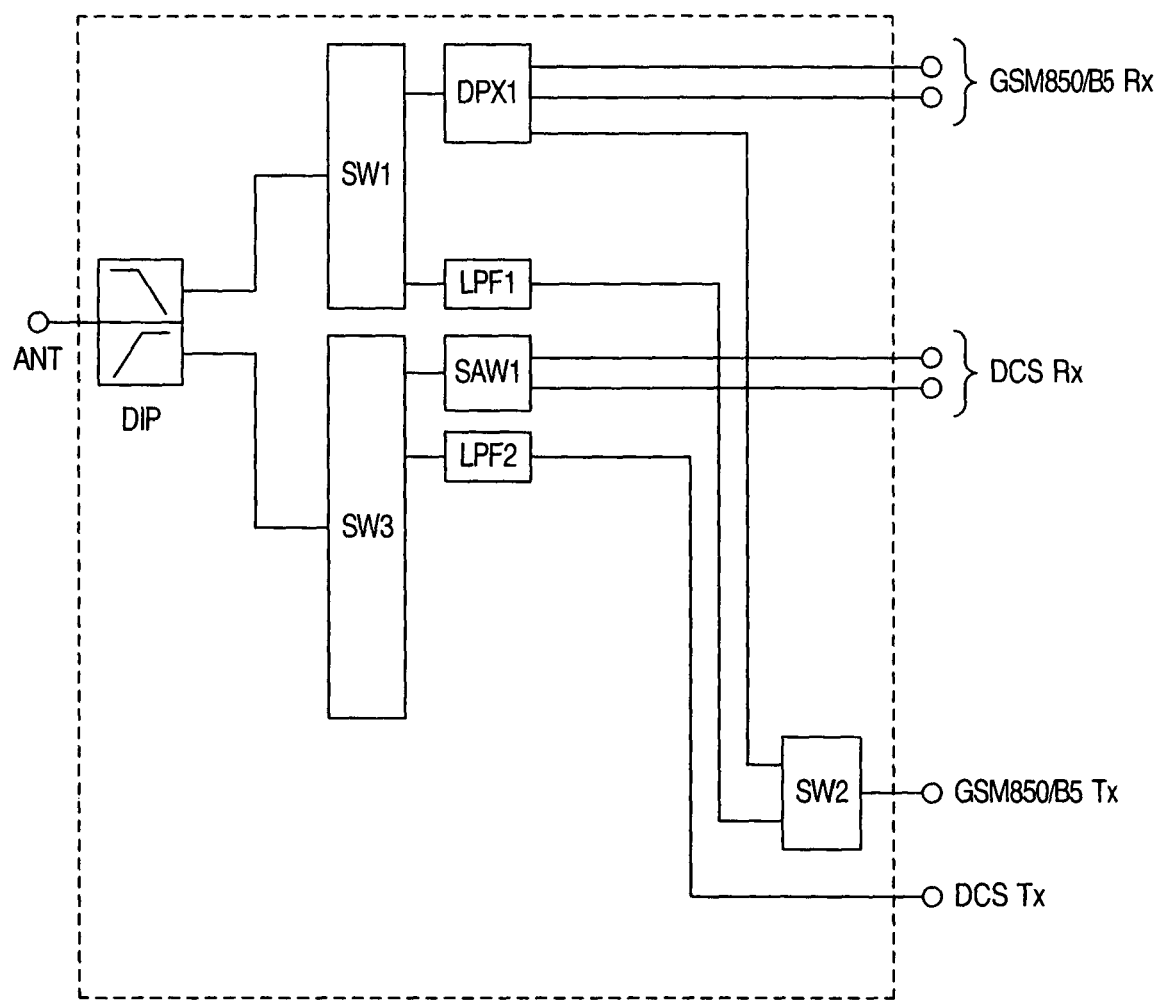
FIG. 3 is a block diagram of an exemplary configuration of a high-frequency circuit apparatus in accordance with Embodiment 3 of the invention.

A high-frequency circuit apparatus in accordance with a third embodiment of the invention is shown in FIG. 3 in block diagram form. This apparatus has the supportability to a TDMA communication system, e.g., GSM850, DCS, and also to a WCDMA communication system, such as B5.

This embodiment is similar in circuit arrangement to the second embodiment of the invention, except that the former uses, in a signal path of the second frequency as wave-separated by the diplexer DIP, a high-frequency switch SW3 and a signal reception side surface acoustic wave (SAW) filter SAW1 and also a low-pass filter LPF2, which will be described below.

The high-frequency switch SW3 switches a signal of the second frequency which is in the high frequency band as has been wave-separated by the diplexer DIP to the signal-receive side SAW filter SAW1 that is connected to a DCS Rx terminal or, alternatively, switches to the diplexer DIP a sending signal which is output from the transmission side low-pass filter LPF2 that is connected to a DCS Tx terminal.

With such an arrangement, letting a send signal that is input to the DCS Tx terminal pass through the low-pass filter LPF2 makes it possible to reduce unnecessary signals that are contained in the send signal. In addition, by causing a received signal that is input from the antenna terminal ANT to pass through the signal-receive side SAW filter SAW1, it is possible to reduce unnecessary signals that are contained in the received signal.

Embodiment 4

Figure 4:
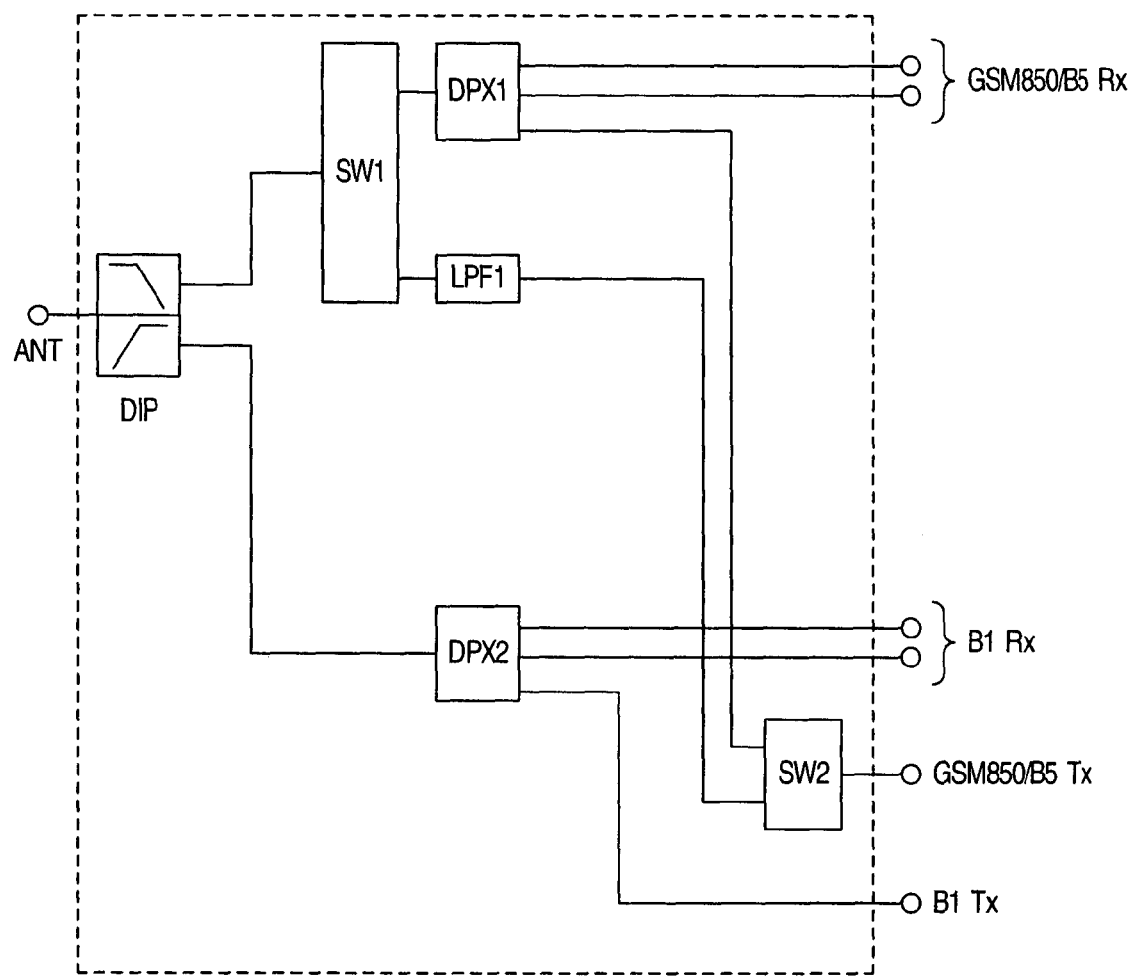
FIG. 4 is a block diagram of an exemplary configuration of a high-frequency circuit apparatus in accordance with Embodiment 4 of the invention.

A high-frequency circuit apparatus in accordance with a fourth embodiment of this invention is illustrated in FIG. 4. The circuit apparatus as shown herein has the supportability to a TDMA communication system, e.g., GSM850, and also to a WCDMA communication system, such as B1 (Band1), B5. A circuit configuration of this embodiment is similar to that of the second embodiment of the invention, except that the former uses a duplexer DPX2, to be later described, in the signal path of the second frequency including the frequency band of B1, which was wave-separated by the diplexer DIP.

The duplexer DPX2 performs the wave separation of a frequency-different signal. More specifically, letting a signal of second frequency that was wave-separated by diplexer DIP to be later described pass through the duplexer DPX2 results in removal of an unnecessary signal(s), whereby a received signal having its frequency of 2110 MHz to 2170 MHz which is an inbound signal frequency band within the frequency band (1920 MHz to 2170 MHz) of B1 is output to a B1 Rx terminal, while causing a send signal as input from a B1 Tx terminal to pass through the duplexer DPX2 to thereby remove unnecessary signals therefrom for output to the diplexer DIP.

With such an arrangement, it is possible to reduce unnecessary signals being contained in the send signal and the received signal while at the same time simplifying the circuit configuration when compared to the third embodiment of the invention.

Embodiment 5

Figure 5:
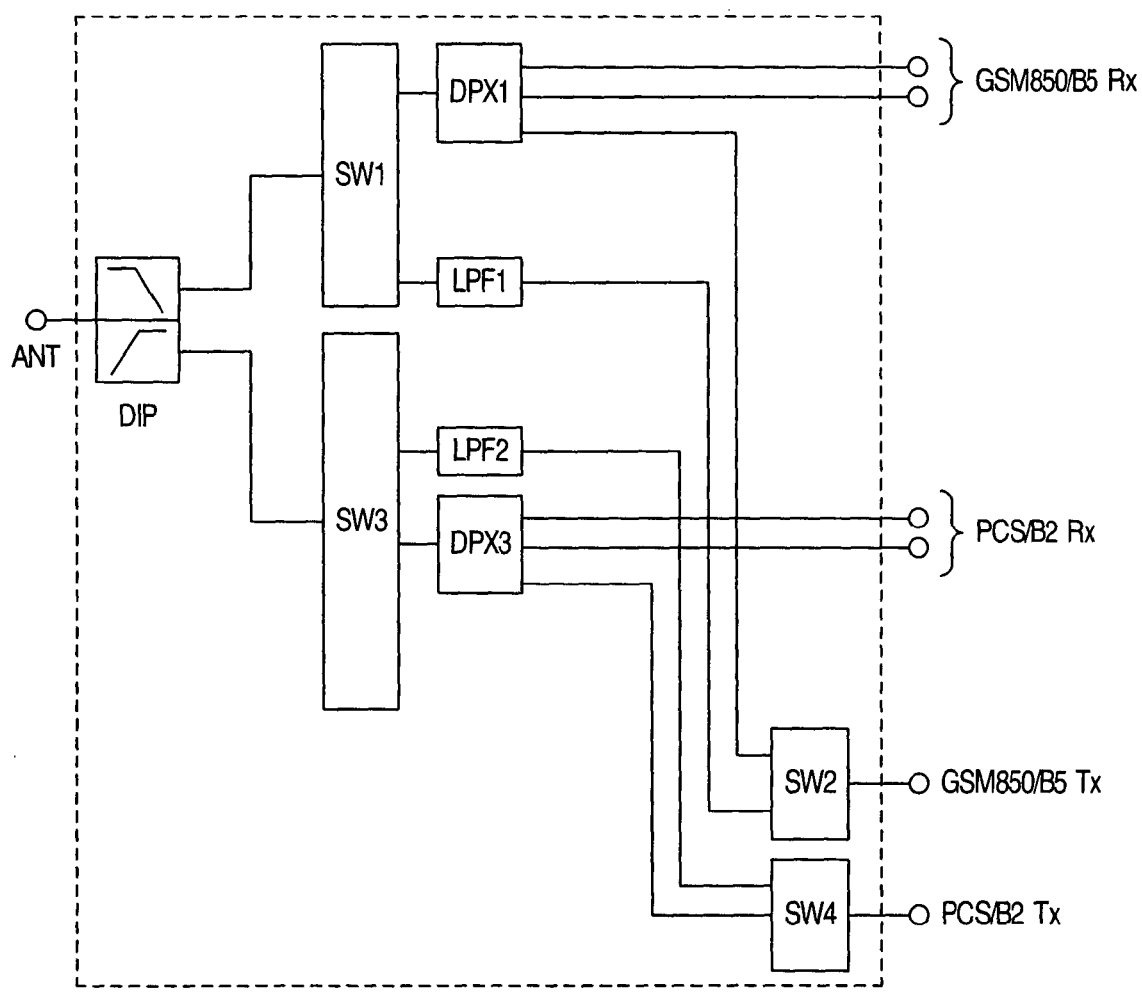
FIG. 5 is a block diagram of an exemplary configuration of a high-frequency circuit apparatus in accordance with Embodiment 5 of the invention.

A high-frequency circuit apparatus in accordance with a fifth embodiment of this invention is shown in FIG. 5. This apparatus has the supportability to a TDMA communication system, e.g., GSM850, PCS, and also to a WCDMA communication system, e.g., B2, B5.

This embodiment is similar in circuit configuration to the second embodiment of the invention, except that the former employs in PCS/B2 signal path a high-frequency switch SW3 as will be described later, a duplexer DPX3 to be later described, a low-pass filter LPF2, and a high-frequency switch SW4 to be set forth later.

The duplexer DPX3 performs the wave separation of a frequency-different signal. More specifically, a signal that is output from the high-frequency switch SW3 as will be described later is guided to pass through the duplexer DPX3 so that unnecessary signals are removed away therefrom, whereby a received signal having its frequency band of 1930 MHz to 1960 MHz that is an inbound signal band within the frequency band (1830 MHz to 1960 MHz) of B2 and a received signal with its frequency band of 1930 MHz to 1990 MHz that is an inbound signal frequency band within the frequency band (1850 MHz to 1990 MHz) of PCS are output to a PCS/B2 Rx terminal while an output signal of the high-frequency switch SW4 passes through the duplexer DPX3 so that unnecessary signals are removed therefrom for output to the high-frequency switch SW3.

The high-frequency switch SW3 switches the signal of the second frequency that is in a high frequency band, which signal was wave-separated by the diplexer DIP, to the duplexer DPX3 and switches to the diplexer DIP the send or outbound signal that is output from the low-pass filter LPF2.

The high-frequency switch SW4 performs switching between signal transmission paths pursuant to a presently activated communication system. In other words, the high-frequency switch SW4 switches a signal as input thereto to either the transmission path of PCS or the transfer path of B2 that is the WCDMA method.

With such an arrangement, usable communication systems increase in number when compared to the second embodiment, resulting in achievement of enhanced multi-functionality. It is also possible, by making the same the signal reception paths of different communication systems of the same frequency band, to permit the required number of the SAW filters or duplexers to decrease from four, as in the prior art, to two.

Embodiment 6

Figure 6:
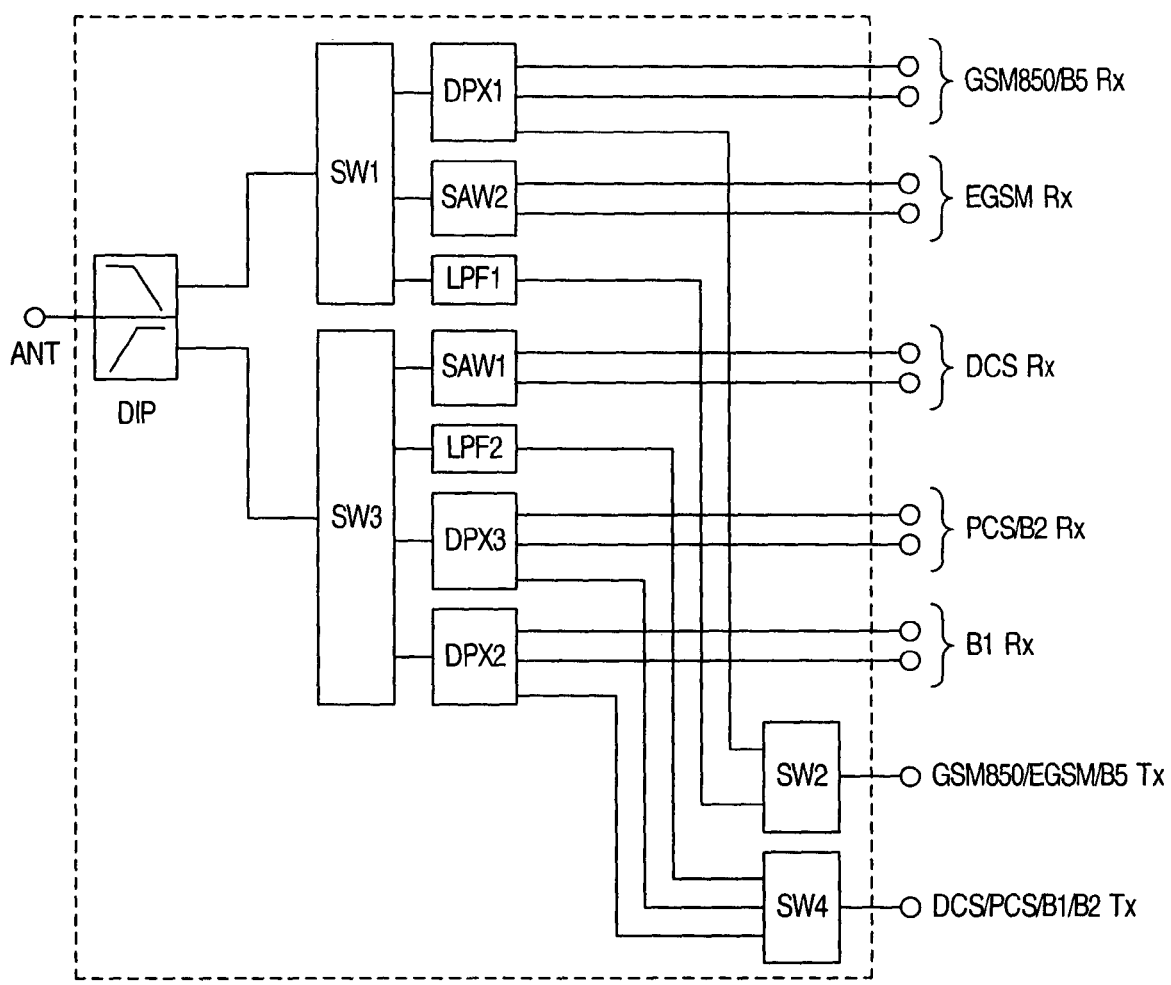
FIG. 6 is a block diagram of an exemplary configuration of a high-frequency circuit apparatus in accordance with Embodiment 6 of the invention.

A high-frequency circuit apparatus in accordance with a sixth embodiment of this invention is shown in FIG. 6. This apparatus is operatively associated with an increased number of telecommunication systems when compared to Embodiment 5. For example, the illustrative circuit apparatus has the supportability to many different types of communication systems, such as GSM850, EGSM, DCS and PCS of the TDMA method and B1, B2 and B5 of the WCDMA technology.

In FIG. 6, the diplexer DIP performs the wave separation of a signal having its frequency band of 824 MHz to 894 MHz of GSM850 which is input from the antenna terminal ANT, a first frequency signal of low frequency band which contains therein a signal with its frequency band of 880 MHz to 960 MHz of EGSM and a signal with a frequency band of 824 MHz to 894 MHz of B5, a signal of a frequency band of 1710 MHz to 1880 MHz of DCS, a signal of a frequency band of 1850 MHz to 1990 MHz of PCS, and a second frequency signal of high frequency band which includes a signal with its frequency band of 1920 MHz to 2170 MHz of B1 and a signal of 1830 MHz-1960 MHz band of B2.

The high-frequency switch SW2 performs the switching of a transmission path per communication system. More precisely, when transmitting an outbound signal of either GSM850 or EGSM of those send signals of GSM850, EGSM, B5 low-frequency band communication systems, which signals are input from a GSM850/EGSM/B5 terminal, the high-frequency switch SW2 switches the outbound signal to the low-pass filter LPF1. When transmitting an outbound signal of B5 that is the WCDMA method, the switch SW2 switches it to the duplexer DPX1.

The high-frequency switch SW4 performs switching between transmission paths on a per-communication system basis. More precisely, the high-frequency switch SW4 switches to the low-pass filter LPF2 a send signal of DCS or PCS of those send signals of high-frequency band communication systems of DCS, PCS, B1 and B2, which signals are input from a DCS/PCS/B1/B2 terminal. This switch SW4 also switches a send signal of B1 to the duplexer DPX2 and switches a send signal of B2 to the duplexer DPX3.

The duplexer DPX1 performs the wave separation of a frequency-different signal in such a way that an output signal of the high-frequency switch SW1 passes through the duplexer DPX1 so that unnecessary signals are removed away therefrom and then a received signal of B5 and a received signal of GSM850, which are of the same frequency band, are output together to a GSM850/B5 Rx terminal.

Additionally, the duplexer DPX3 performs wave separation of a frequency-different signal in a way such that an output signal of the high-frequency switch SW3 is guided to pass through the duplexer DPX3 so that unnecessary signals are removed therefrom and then a received signal of B2 having a frequency of 1930 MHz to 1960 MHz and a received signal of PCS with its frequency of 1930 MHz to 1990 MHz, which are in the same frequency band, are output to a PCS/B2 Rx terminal.

The duplexer DPX2 performs the wave separation of a frequency-different signal in a way such that an output signal of the high-frequency switch SW3 passes through the duplexer DPX3 so that unnecessary signals are removed away therefrom whereby the resultant signal is output to a B1 Rx terminal.

The high-frequency switch SW1 switches the first frequency signal of low frequency band which was wave-separated by the diplexer DIP to either the duplexer DPX1 or the signal-receive side SAW filter SAW2 that is connected to an EGSM Rx terminal, and switches to the diplexer DIP a send signal which is output from the transmission side low-pass filter LPF1 that is connected to the switch SW2.

The high-frequency switch SW3 switches a signal of the second frequency of high frequency band which was wave-separated by the diplexer DIP to any one of the duplexer DPX2 and the duplexer DPX3 and the signal-receive side SAW filter SAW1 that is connected to the B1 Rx terminal while switching to the diplexer DIP a send signal which is output from the transmission side low-pass filter LPF2 that is connected to the switch SW4 stated supra.

With such an arrangement, usable communication systems increase in number when compared to the fifth embodiment, so multi-functionality is achievable successfully.

Embodiment 7

Figure 7:
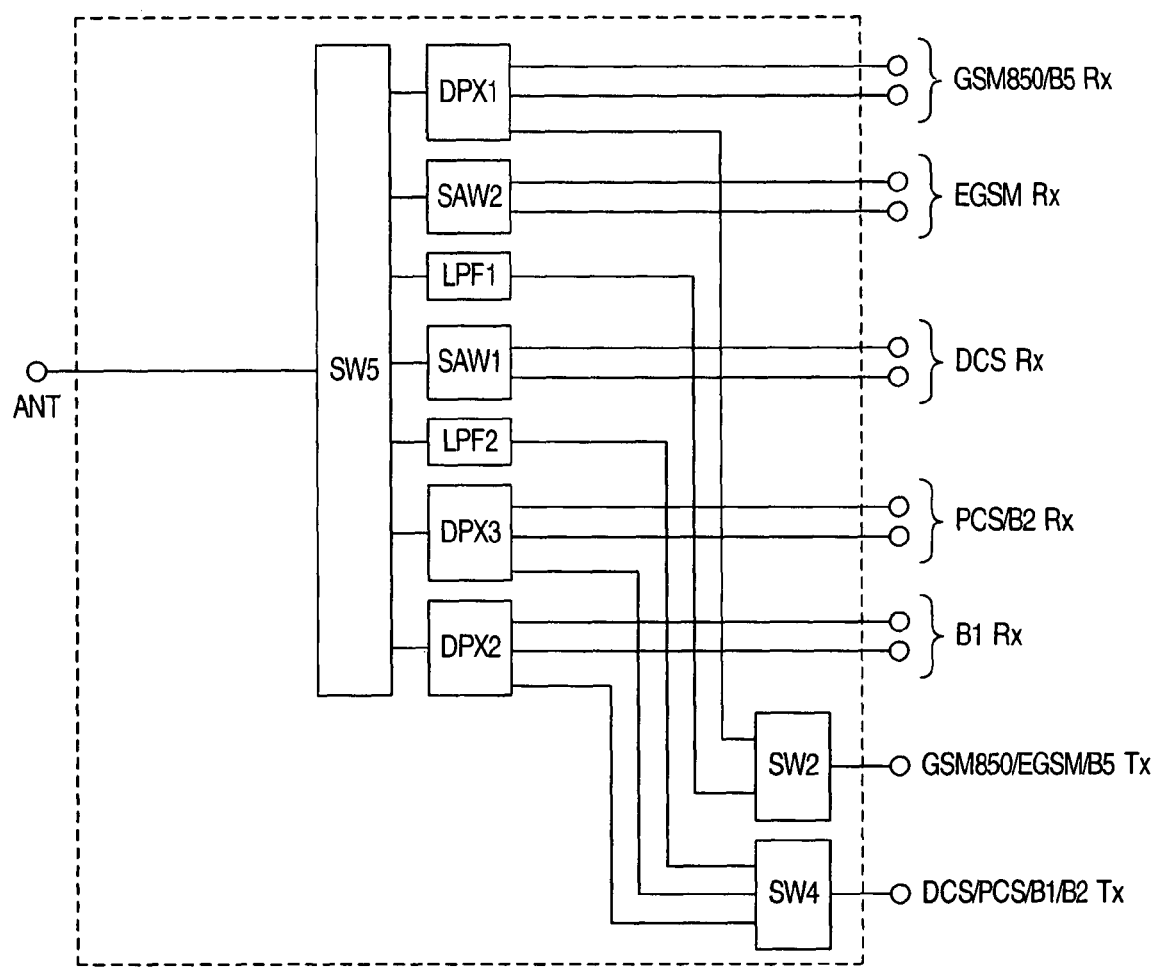
FIG. 7 is a block diagram of an exemplary configuration of a high-frequency circuit apparatus in accordance with Embodiment 7 of the invention.

A high-frequency circuit apparatus in accordance with a seventh embodiment of the invention is shown in FIG. 7. This apparatus is similar to that of the sixth embodiment except that the diplexer DIP at the post-stage of the antenna terminal ANT and the high-frequency switches SW1 and SW2 are deleted, and a switch SW5 which operates to switch between signal-sending/receiving paths is provided for selective connection to the antenna terminal ANT, duplexer DPX1, signal receive side SAW filter SAW2, low-pass filter LPF1, signal receive side SAW filter SAW1, low-pass filter LPF2, duplexer DPX3 and duplexer DPX2.

With such an arrangement, the circuit configuration becomes simplified when compared to the sixth embodiment.

Embodiment 8

Figure 8:
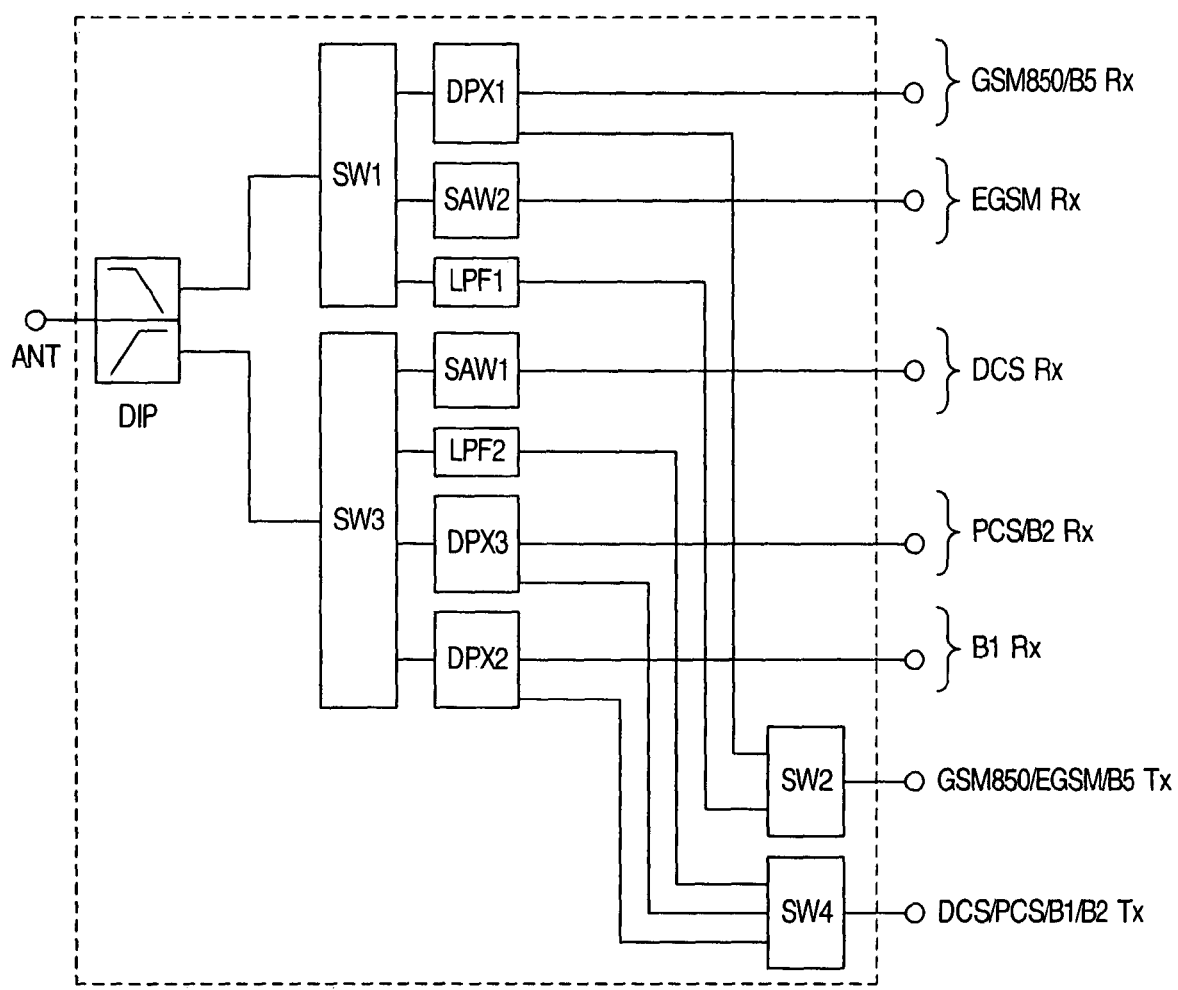
FIG. 8 is a block diagram of an exemplary configuration of a high-frequency circuit apparatus in accordance with Embodiment 8 of the invention.

A high-frequency circuit apparatus in accordance with an eighth embodiment of the invention is depicted in FIG. 8 in block diagram form.

This circuit apparatus is similar to that of Embodiment 6 with the duplexers DPX1-DPX3 and signal-receive side SAW filters SAW1-2 being modified so that an output terminal of each is a single output. With such an arrangement, the output terminals required decrease in number, resulting in the circuit configuration becoming simplified.

Embodiment 9

Figure 9:
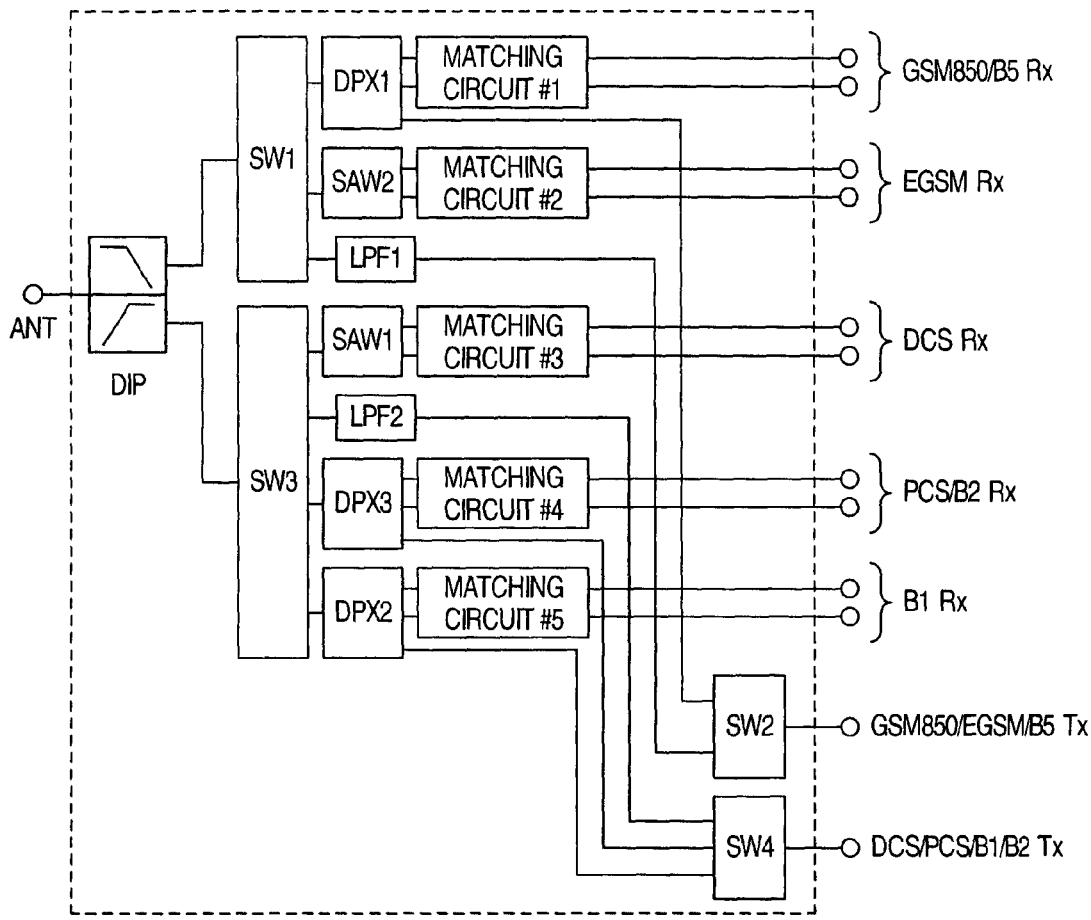
FIG. 9 is a block diagram of an exemplary configuration of a high-frequency circuit apparatus in accordance with Embodiment 9 of the invention.

A high-frequency circuit apparatus in accordance with a ninth embodiment of the invention is shown in FIG. 9. This apparatus has several matching circuits for taking matching with external circuitry, i.e., a matching circuit #1 which is connected between the duplexer DPX1 and GSM850/B5 Rx terminal, a matching circuit #2 that is coupled between the signal receive side SAW filter SAW2 and EGSM Rx terminal, a matching circuit #3 between the signal receive side SAW filter SAW1 and DCS Rx terminal, a matching circuit #4 between the duplexer DPX3 and PCS/B2 Rx terminal, and a matching circuit #5 between the duplexer DPX2 and B1 Rx terminal. Each matching circuit is made up of more than one inductor and more than one capacitor. Letting the inductor and capacitor be small in inductance and capacitance thereof makes it possible to embed the matching circuits in a multi-layered circuit board or substrate.

Embodiment 10

Figure 10:
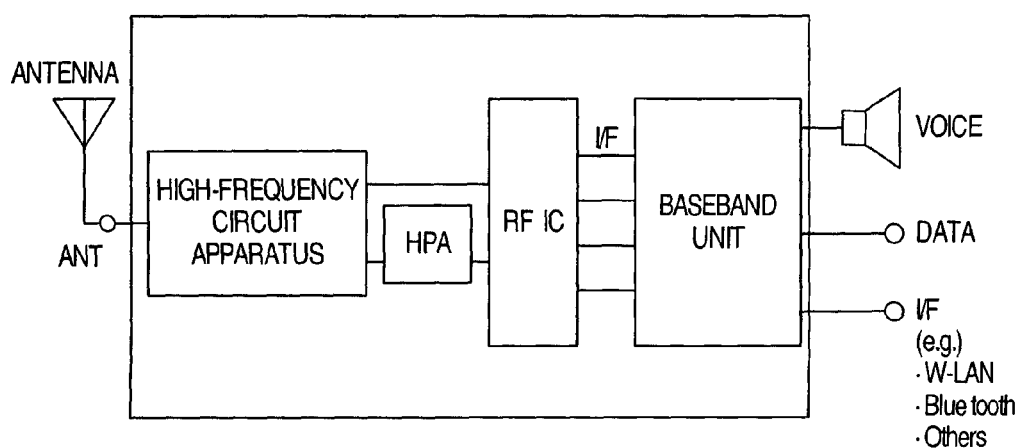
FIG. 10 is a block diagram showing one example of an internal configuration of a high-frequency circuit apparatus adaptable for use in a mobile telephone system in accordance with Embodiment 10 of the invention.

A mobile cellular phone telecommunications system is shown in FIG. 10, which has multiple functionalities, such as over-the-air voice communications, data communications, local area network (LAN) connectivity and others. This system includes a high-frequency circuit apparatus, which is any one of Embodiments 1 to 9, and a built-in SAW filter or duplexer that is disposed between an antenna and an RFIC.

In the system of FIG. 10, a receiver unit receives an inbound signal which is received by the antenna. This received signal is input to the high-frequency circuit apparatus. A signal processed by this apparatus is then input to a baseband unit via the RFIC. A signal as processed thereby is output from an output unit, such as a voice/audio output unit, data output unit or interface (I/F) unit. A transmitter unit permits an outbound signal that is output from the baseband unit to pass through the high-frequency circuit apparatus via the RFIC and/or a high-power amplifier (PHA) for output from the antenna.

It should be noted that although in this embodiment a GaAs switch was used as the switch, this invention should not exclusively be limited thereto and the switch may be replaced with other similar switches including, but not limited to, a semiconductor switch, such as a complementary metal oxide semiconductor (CMOS) switch, a high electron mobility transistor (HEMT) switch, and a switch which utilizes micro-electromechanical systems (MEMS) or else.

Additionally, although in the above-stated Embodiments 1 to 10 the high-frequency circuit apparatuses have been described which offer the supportability to a combination of TDMA communication systems of GSM850, EGSM, DCS and PCS and WCDMA communication systems of B1, B2 and B5 by way of example, this invention should not be limited thereto. Similar results are obtainable in high-frequency circuit apparatuses with a combination of a plurality of systems, such as a personal digital cellular (PDC) access method and WCDMA, WCDMA and narrow-band CDMA, etc., in case inbound signals received are substantially substantially the same in frequency band as each other.

Also note that the high-frequency circuit apparatus in accordance with any one of the above-stated embodiments is utilizable for mobile telephones with the co-existence of various types of telecommunications systems, including but not limited to TDMA, CDMA and WCDMA technologies.

According to this invention, it becomes possible to miniaturize the high-frequency circuit apparatus and downsize the communication apparatus with this circuit apparatus being built therein.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A high-frequency circuit apparatus with supportability to a plurality of frequency bands including a band of TDMA method and a band of CDMA method, said apparatus comprising:
 a second high-frequency switch for switching an input send signal between a transmission path of a first communication system of the TDMA method and a transmission path of a seventh communication system of the CDMA method;
 a first low-pass filter for causing attenuation of an unnecessary signal from one send signal as switched by said second high-frequency switch;
 a first duplexer having a first port, a second port and a third port, for outputting to the second port a remaining send signal which is input from the first port and switched by said second high-frequency switch while applying thereto wave separation with a received signal different in frequency from the send signal and for outputting to the third port a received signal of said first communication system to be input from the second port and a received signal of said seventh communication system, which are in the same frequency band;
 a first high-frequency switch for switching a received signal as input from an antenna terminal to the second port of said first duplexer and for switching to said antenna terminal both said send signal which is wave-separated by said first duplexer and is output from said second port and a send signal as output from said first low-pass filter; and
 a diplexer for transmitting toward an antenna a send signal of one of said first communication system and a third communication system each being the TDMA method and said seventh communication system being the CDMA method and for performing, in a signal reception event, wave separation of a signal of a first frequency in the frequency band of said first communication system and said seventh communication system and a signal of a second frequency of said third communication system being in a frequency band higher than said first frequency, wherein
 said first high-frequency switch switches the signal of said first frequency as output from said diplexer to said first duplexer and for switching an output signal of said first low-pass filter to said diplexer; and
 wherein said diplexer further transmits to the antenna a send signal of one of said first communication system and a fourth communication system each of which is the TDMA method and a sixth communication system and said seventh communication system each of which is the CDMA method and for performing, in a signal reception event, wave separation of the signal of said second frequency including both said first frequency and frequency bands of said fourth communication system and said sixth communication system, and wherein said apparatus further comprises:
 a fourth high-frequency switch for switching between a signal transmission path of said fourth communication system and a signal transmission path of said sixth communication system,
 a second low-pass filter for attenuation of an unnecessary signal of a signal to be output from said fourth high-frequency switch,
 a third duplexer for performing wave separation of a send signal of said fifth communication system or said sixth communication system and a received signal different in frequency band from such the send signal and for causing signal reception paths of respective received signals of the fourth and sixth communication systems, which are in the same frequency band, to be the same as each other, and
 a third high-frequency switch for switching the signal of said second frequency as output from said diplexer to said third duplexer and for switching an output signal of said second low-pass filter to said diplexer.

2. A high-frequency circuit apparatus with supportability to a plurality of frequency bands including a band of TDMA method and a band of CDMA method, said apparatus comprising:

a second high-frequency switch for switching an input send signal between a transmission path of a first communication system of the TDMA method and a transmission path of a seventh communication system of the CDMA method;

a first low-pass filter for causing attenuation of an unnecessary signal from one send signal as switched by said second high-frequency switch;

a first duplexer having a first port, a second port and a third port, for outputting to the second port a remaining send signal which is input from the first port and switched by said second high-frequency switch while applying thereto wave separation with a received signal different in frequency from the send signal and for outputting to the third port a received signal of said first communication system to be input from the second port and a received signal of said seventh communication system, which are in the same frequency band;

a first high-frequency switch for switching a received signal as input from an antenna terminal to the second port of said first duplexer and for switching to said antenna terminal both said send signal which is wave-separated by said first duplexer and is output from said second port and a send signal as output from said first low-pass filter; and a diplexer for transmitting toward an antenna a send signal of one of said first communication system and a third communication system each being the TDMA method and said seventh communication system being the CDMA method and for performing, in a signal reception event, wave separation of a signal of a first frequency in the frequency band of said first communication system and said seventh communication system and a signal of a second frequency of said third communication system being in a frequency band higher than said first frequency, wherein said first high-frequency switch switches the signal of said first frequency as output from said diplexer to said first duplexer and for switching an output signal of said first low-pass filter to said diplexer; and wherein said diplexer further transmits to the antenna a send signal of one of the first to fourth communication systems of the TDMA method and the fifth to seventh communication systems of the CDMA method, and for performing, in a signal reception event, wave separation of the signal of said first frequency including frequency bands of the first, second and seventh communication systems and the signal of said second frequency including frequency bands of the third to sixth communication systems, wherein said second high-frequency switch performs switching between a signal transmission path in common for the first and second communication systems and a signal transmission path of said seventh communication system, said first low-pass filter causes attenuation of an unnecessary signal contained in send signals of said first and second communication systems to be output from said high-frequency switch, said first high-frequency switch switches the signal of said first frequency as output from said diplexer to either said first duplexer or the signal reception path of said second communication system and for switching the output signal of said first low-pass filter to said diplexer, and said apparatus further comprises, a fourth high-frequency switch for switching a signal transmission path being common to said third communication system and said fourth communication system, a signal transmission path of said fifth communication system, and a signal transmission path of said sixth communication system, a second low-pass filter connected to one of the signal transmission paths to be switched by said fourth communication system, for attenuating an unnecessary signal of the send signal to be output from said fourth high-frequency switch, a second duplexer for separating to a signal reception path the received signal of said fourth communication system contained in said second frequency separated by said diplexer and for causing the send signal of said fourth communication system to pass therethrough toward said diplexer, a third duplexer for performing wave separation of a send signal of either said fourth communication system or said sixth communication system and a received signal different in frequency band from such the signal and for causing signal reception paths of received signals of the fifth and sixth communication systems, which are in the same frequency band, to be the same as each other, a third high-frequency switch for switching the signal of said second frequency as output from said diplexer to one of said second duplexer, said third duplexer and the signal reception path of said third communication system or for switching the output signal of said second low-pass filter to said diplexer, said first SAW filter for filtering a signal to be output from said third high-frequency switch to thereby permit only a received signal of said third communication system to pass therethrough, and a second SAW filter for filtering a signal being output from said first high-frequency switch to thereby permit only a received signal of said second communication system to pass therethrough.

3. A high-frequency circuit apparatus with supportability to a plurality of frequency bands including a band of TDMA method and a band of CDMA method, said apparatus comprising:

a second high-frequency switch for switching an input send signal between a transmission path of a first communication system of the TDMA method and a transmission path of a seventh communication system of the CDMA method;

a first low-pass filter for causing attenuation of an unnecessary signal from one send signal as switched by said second high-frequency switch;

a first duplexer having a first port, a second port and a third port, for outputting to the second port a remaining send signal which is input from the first port and switched by said second high-frequency switch while applying thereto wave separation with a received signal different in frequency from the send signal and for outputting to the third port a received signal of said first communication system to be input from the second port and a received signal of said seventh communication system, which are in the same frequency band;

a first high-frequency switch for switching a received signal as input from an antenna terminal to the second port of said first duplexer and for switching to said antenna terminal both said send signal which is wave-separated by said first duplexer and is output from said second port and a send signal as output from said first low-pass filter; and a diplexer for transmitting toward an antenna a send signal of one of said first communication system and a third communication system each being the TDMA method and said seventh communication system being the CDMA method and for performing, in a signal reception event, wave separation of a signal of a first frequency in the frequency band of said first communication system and said seventh communication system and a signal of a second frequency of said third communication system being in a frequency band higher than said first frequency, wherein said first high-frequency switch switches the signal of said first frequency as output from said diplexer to said first duplexer and for switching an output signal of said first low-pass filter to said diplexer; and wherein said diplexer further transmits to the antenna a send signal of one of the first to fourth communication systems of the TDMA method and the fifth to seventh communication systems of the CDMA method, and for performing, in a signal reception event, wave separation of the signal of said first frequency including frequency bands of the first, second and seventh communication systems and the signal of said second frequency including frequency bands of the third to sixth communication systems, wherein said second high-frequency switch performs switching between a signal transmission path in common for the first and second communication systems and a signal transmission path of said seventh communication system, said first low-pass filter causes attenuation of an unnecessary signal contained in send signals of said first and second communication systems to be output from second high-frequency switch, said first high-frequency switch switches the signal of said first frequency as output from said diplexer to either said first duplexer or the signal reception path of said second communication system and for switching the output signal of said first low-pass filter to said diplexer, and said apparatus further comprises, a fourth high-frequency switch for switching a signal transmission path being common to said third communication system and said fourth communication system, a signal transmission path of said fifth communication system, and a signal transmission path of said sixth communication system, a second low-pass filter connected to one of the signal transmission paths to be switched by said fourth communication system, for attenuating an unnecessary signal of the send signal to be output from said fourth high-frequency switch, a second duplexer for separating to a signal reception path the received signal of said fourth communication system contained in said second frequency separated by said diplexer and for causing the send signal of said fourth communication system to pass therethrough toward said diplexer, a third duplexer for performing wave separation of a send signal of either said fourth communication system or said sixth communication system and a received signal different in frequency band from such the signal and for causing signal reception paths of received signals of the fifth and sixth communication systems, which are in the same frequency band, to be the same as each other, a third high-frequency switch for switching the signal of said second frequency as output from said diplexer to one of said second duplexer, said third duplexer and the signal reception path of said third communication system or for switching the output signal of said second low-pass filter to said diplexer, said first SAW filter for filtering a signal to be output from said third high-frequency switch to thereby permit only a received signal of said third communication system to pass therethrough, a second SAW filter for filtering a signal being output from said first high-frequency switch to thereby permit only a received signal of said second communication system to pass therethrough, and wherein said first duplexer, said first SAW filter, said second SAW filter, said second duplexer and said third duplexer have output nodes each being formed of a single output.

4. A high-frequency circuit apparatus with supportability to a plurality of frequency bands including a band of TDMA method and a band of CDMA method, said apparatus comprising:

a second high-frequency switch for switching an input send signal between a transmission path of a first communication system of the TDMA method and a transmission path of a seventh communication system of the CDMA method;

a first low-pass filter for causing attenuation of an unnecessary signal from one send signal as switched by said second high-frequency switch;

a first duplexer having a first port, a second port and a third port, for outputting to the second port a remaining send signal which is input from the first port and switched by said second high-frequency switch while applying thereto wave separation with a received signal different in frequency from the send signal and for outputting to the third port a received signal of said first communication system to be input from the second port and a received signal of said seventh communication system, which are in the same frequency band;

a first high-frequency switch for switching a received signal as input from an antenna terminal to the second port of said first duplexer and for switching to said antenna terminal both said send signal which is wave-separated by said first duplexer and is output from said second port and a send signal as output from said first low-pass filter; and a diplexer for transmitting toward an antenna a send signal of one of said first communication system and a third communication system each being the TDMA method and said seventh communication system being the CDMA method and for performing, in a signal reception event, wave separation of a signal of a first frequency in the frequency band of said first communication system and said seventh communication system and a signal of a second frequency of said third communication system being in a frequency band higher than said first frequency, wherein said first high-frequency switch switches the signal of said first frequency as output from said diplexer to said first duplexer and for switching an output signal of said first low-pass filter to said diplexer; and wherein said diplexer further transmits to the antenna a send signal of one of the first to fourth communication systems of the TDMA method and the fifth to seventh communication systems of the CDMA method, and for performing, in a signal reception event, wave separation of the signal of said first frequency including frequency bands of the first, second and seventh communication systems and the signal of said second frequency including frequency bands of the third to sixth communication systems, wherein said second high-frequency switch performs switching between a signal transmission path in common for the first and second communication systems and a signal transmission path of said seventh communication system, said first low-pass filter causes attenuation of an unnecessary signal contained in send signals of said first and second communication systems to be output from said second high-frequency switch, said first high-frequency switch switches the signal of said first frequency as output from said diplexer to either said first duplexer or the signal reception path of said second communication system and for switching the output signal of said first low-pass filter to said diplexer, and said apparatus further comprises, a fourth high-frequency switch for switching a signal transmission path being common to said third communication system and said fourth communication system, a signal transmission path of said fifth communication system, and a signal transmission path of said sixth communication system, a second low-pass filter connected to one of the signal transmission paths to be switched by said fourth communication system, for attenuating an unnecessary signal of the send signal to be output from said fourth high-frequency switch, a second duplexer for separating to a signal reception path the received signal of said fourth communication system contained in said second frequency separated by said diplexer and for causing the send signal of said fourth communication system to pass therethrough toward said diplexer, a third duplexer for performing wave separation of a send signal of either said fourth communication system or said sixth communication system and a received signal different in frequency band from such the signal and for causing signal reception paths of received signals of the fifth and sixth communication systems, which are in the same frequency band, to be the same as each other, a third high-frequency switch for switching the signal of said second frequency as output from said diplexer to one of said second duplexer, said third duplexer and the signal reception path of said third communication system or for switching the output signal of said second low-pass filter to said diplexer, said first SAW filter for filtering a signal to be output from said third high-frequency switch to thereby permit only a received signal of said third communication system to pass therethrough, a second SAW filter for filtering a signal being output from said first high-frequency switch to thereby permit only a received signal of said second communication system to pass therethrough, said first duplexer, said first SAW filter, said second SAW filter, said second duplexer and said third duplexer have output nodes each being formed of a single output, and a first matching circuit for providing matching between said first duplexer and the external circuit;

a second matching circuit for providing matching between said first SAW filter and the external circuit;

a third matching circuit for providing matching between said second SAW filter and the external circuit;

a fourth matching circuit for providing matching between said second duplexer and the external circuit; and a fifth matching circuit for providing matching between said third duplexer and the external circuit.

* * * * *